US012671364B2

(12) United States Patent
Hao et al.

(10) Patent No.: US 12,671,364 B2
(45) Date of Patent: Jun. 30, 2026

(54) MULTI-MODE VOLTAGE-CONTROLLED OSCILLATOR (VCO) WITH TRANSFORMER-BASED COUPLING

(71) Applicant: QUALCOMM Incorporated, San Diego, CA (US)

(72) Inventors: Shilei Hao, San Diego, CA (US); Yiwu Tang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 18/939,145

(22) Filed: Nov. 6, 2024

(65) Prior Publication Data

US 2026/0128714 A1     May 7, 2026

(51) Int. Cl.
*H03B 5/12* (2006.01)

(52) U.S. Cl.
CPC ......... *H03B 5/1296* (2013.01); *H03B 5/1212* (2013.01); *H03B 5/124* (2013.01)

(58) Field of Classification Search
USPC .................................................. 331/117 FE
See application file for complete search history.

(56) References Cited

U.S. PATENT DOCUMENTS

| | | |
|---|---|---|
| 9,819,307 B2 | 11/2017 | Farazian et al. |
| 11,303,245 B2 | 4/2022 | Sadhu |
| 2010/0321124 A1 | 12/2010 | Rangarajan et al. |

| | | | |
|---|---|---|---|
| 2011/0148535 A1* | 6/2011 | Lee ...................... | H03B 5/1215 |
| | | | 331/117 FE |
| 2014/0009236 A1 | 1/2014 | Choi et al. | |
| 2014/0266479 A1 | 9/2014 | Rong et al. | |
| 2016/0099679 A1* | 4/2016 | Babaie ................. | H03B 5/1293 |
| | | | 331/117 FE |
| 2023/0353091 A1 | 11/2023 | Spataro et al. | |
| 2025/0105786 A1* | 3/2025 | Elaasar ............... | H03B 5/1243 |

FOREIGN PATENT DOCUMENTS

| | | |
|---|---|---|
| KR | 101330657 B1 | 11/2013 |
| KR | 101503505 B1 | 3/2015 |
| WO | 2017075597 A1 | 5/2017 |
| WO | 2023088004 A1 | 5/2023 |

OTHER PUBLICATIONS

International Search Report and Written Opinion—PCT/US2025/053798—ISA/EPO—Feb. 6, 2026.

* cited by examiner

*Primary Examiner* — Joseph Chang
(74) *Attorney, Agent, or Firm* — Gerald P. Joyce, III

(57) ABSTRACT

Techniques and apparatus for oscillating signal generation using a multi-mode voltage-controlled oscillator (VCO) circuit with transformer-based coupling. An example VCO circuit generally includes a first pair of transistors associated with a first active negative transconductance circuit; a second pair of transistors associated with a second active negative transconductance circuit; a transformer comprising a primary winding and a secondary winding, the primary winding being coupled to the second pair of transistors; a first set of switches coupled between gates of the first pair of transistors and the secondary winding of the transformer; and a second set of switches coupled between the gates of the first pair of transistors and a first voltage node.

26 Claims, 9 Drawing Sheets

| Switch | NMOS Mode | CMOS Mode |
|---|---|---|
| SW1 & SW2 | Off | On |
| SW3 & SW4 | On | Off |
| SW5 | On | Off |

| Switch | NMOS Mode | CMOS Mode |
|---|---|---|
| S1 & S2 | Off | On |
| S3 | Switch to $V_{hi}$ | Switch to $V_b$ |
| S4 | On | Off |

| Switch | NMOS Mode | CMOS Mode |
|--------|-----------|-----------|
| SW1 & SW2 | Off | On |
| SW3 & SW4 | On | Off |
| SW5 | On | Off |

| Switch | PMOS Mode | CMOS Mode |
|---|---|---|
| SW6 & SW7 | Off | On |
| SW8 & SW9 | On | Off |
| SW10 | On | Off |

| Switch | NMOS Mode | PMOS Mode | CMOS Mode |
|---|---|---|---|
| SW1 & SW2 | Off | On | On |
| SW3 & SW4 | On | Off | Off |
| SW6 & SW7 | On | Off | On |
| SW8 & SW9 | Off | On | Off |
| SW11 | Switch to $V_{DD}$ | Switch to GND | Off |

| Switch | NMOS Mode | PMOS Mode | CMOS Mode |
|---|---|---|---|
| SW1 & SW2 | Off | On | On |
| SW3 & SW4 | On | Off | Off |
| SW6 & SW7 | On | Off | On |
| SW8 & SW9 | Off | On | Off |
| SW11 | Switch to $V_{DD}$ | Switch to GND | Off |

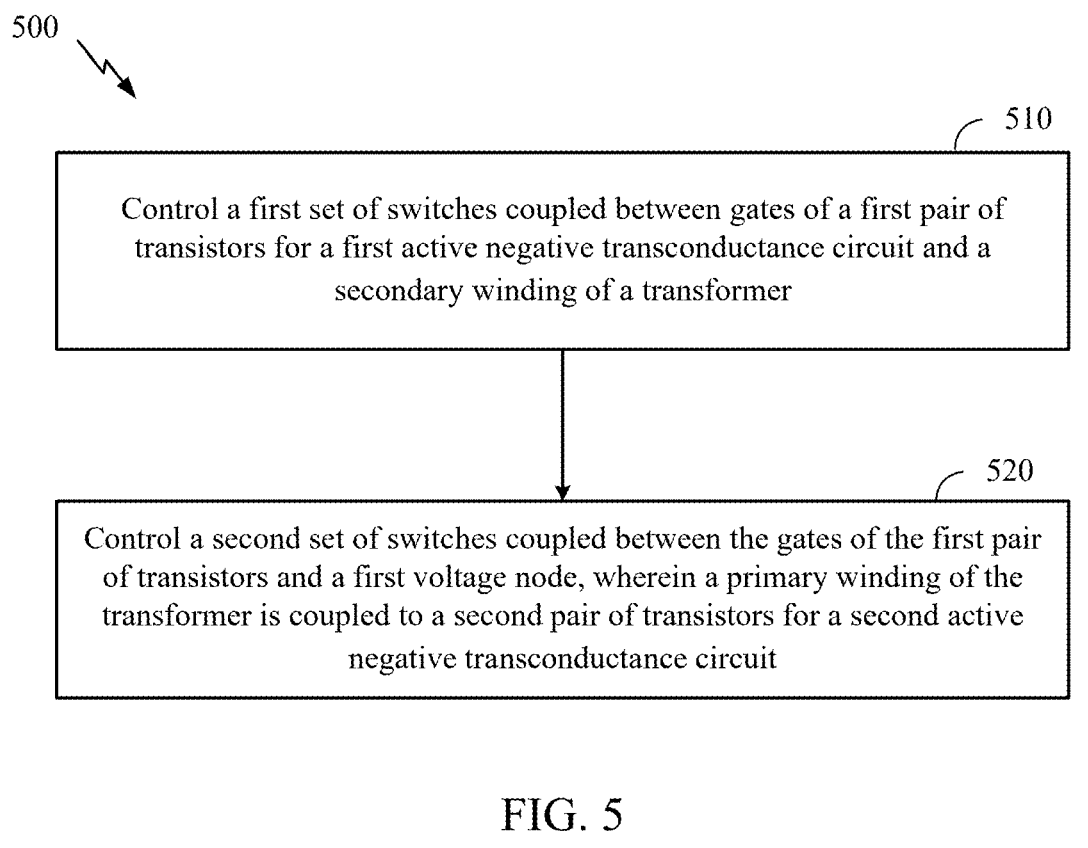

500

510

Control a first set of switches coupled between gates of a first pair of transistors for a first active negative transconductance circuit and a secondary winding of a transformer

520

Control a second set of switches coupled between the gates of the first pair of transistors and a first voltage node, wherein a primary winding of the transformer is coupled to a second pair of transistors for a second active negative transconductance circuit

FIG. 5

MULTI-MODE VOLTAGE-CONTROLLED OSCILLATOR (VCO) WITH TRANSFORMER-BASED COUPLING

TECHNICAL FIELD

Certain aspects of the present disclosure generally relate to electronic circuits and, more particularly, to voltage-controlled oscillators (VCOs) with transformer-based coupling.

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include at least one phase-locked loop (PLL), which may be used, for example, in a frequency synthesizer to generate and control a local oscillator (LO) signal for mixing with a baseband signal (or a radio frequency (RF) signal) for upconversion (or downconversion) to an intermediate frequency (IF) signal or an RF signal (or an IF signal or a baseband signal) before transmission (after reception). The frequency synthesizer may include a voltage-controlled oscillator (VCO) for tuning an oscillating signal to different frequencies.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure generally relate to oscillating signal generation using a multi-mode voltage-controlled oscillator (VCO) circuit with transformer-based coupling.

Certain aspects of present disclosure are directed to a VCO circuit. The VCO circuit generally includes a first pair of transistors associated with a first active negative transconductance circuit; a second pair of transistors associated with a second active negative transconductance circuit; a transformer comprising a primary winding and a secondary winding, the primary winding being coupled to the second pair of transistors; a first set of switches coupled between gates of the first pair of transistors and the secondary winding of the transformer; and a second set of switches coupled between the gates of the first pair of transistors and a first voltage node. The first pair of transistors may be configured to selectively implement the first active negative transconductance circuit, and the second pair of transistors may be configured to selectively implement the second active negative transconductance circuit.

Certain aspects of the present disclosure are directed to a method of oscillating signal generation using a VCO circuit. The method generally includes controlling a first set of switches coupled between gates of a first pair of transistors for a first active negative transconductance circuit and a secondary winding of a transformer; and controlling a second set of switches coupled between the gates of the first pair of transistors and a first voltage node, wherein a primary winding of the transformer is coupled to a second pair of transistors for a second active negative transconductance circuit.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 5 is a flow diagram of example operations for generating an oscillating signal, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure provide a multi-mode voltage-controlled oscillator (VCO) circuit with transformer-based coupling and techniques for generating an oscillating signal using such a VCO circuit. Such a VCO circuit may include a transformer, a p-type active negative transconductance circuit, and an n-type active negative transconductance circuit. Using different configurations of switches, the VCO circuit with transformer-based coupling may be configured for n-type metal-oxide-semiconductor (NMOS), p-type metal-oxide-semiconductor (PMOS), or complementary metal-oxide-semiconductor (CMOS) operational modes. In this manner, the VCO circuit may achieve negative transconductance without alternating current (AC) coupling capacitors and bias resistors.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
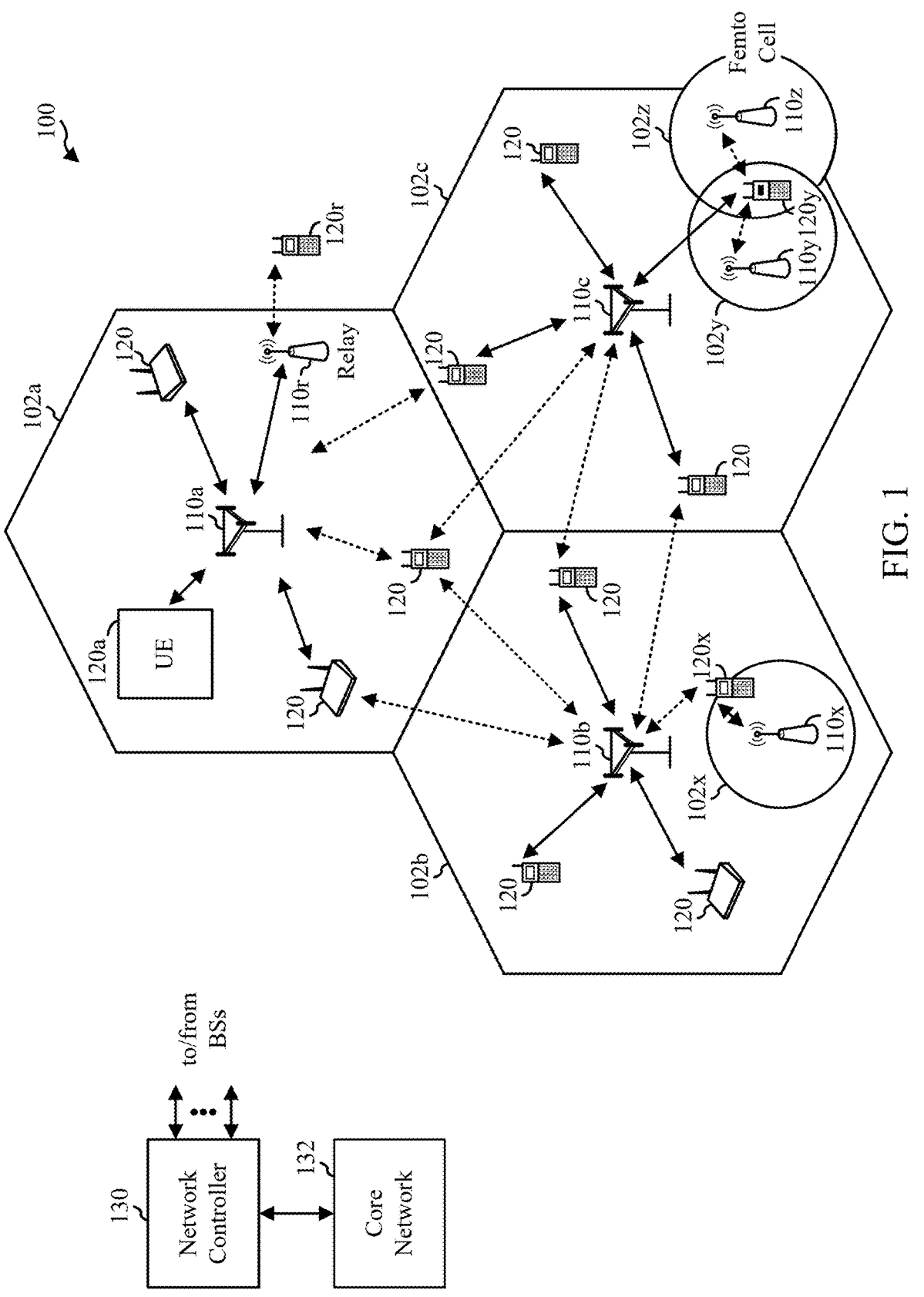
FIG. 1 is a diagram of an example wireless communications network, in which aspects of the present disclosure may be practiced.

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110a-z (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110a, 110b, and 110c may be macro BSs for the macro cells 102a, 102b, and 102c, respectively. The BS 110x may be a pico BS for a pico cell 102x. The BSs 110y and 110z may be femto BSs for the femto cells 102y and 102z, respectively. A BS may support one or multiple cells.

The BSs 110 communicate with one or more user equipments (UEs) 120a-y (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, an augmented reality device, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, Nd UEs may be selected for simultaneous transmission on the downlink. $N_{up}$ may or may not be equal to Nd, and $N_{up}$ and $N_{dn}$ may be static values or can change for each scheduling interval. Beam-steering or some other spatial processing technique may be used at the BSs 110 and/or UEs 120.

The UEs 120 (e.g., 120x, 120y, etc.) may be dispersed throughout the wireless communications network 100, and each UE 120 may be stationary or mobile. The wireless communications network 100 may also include relay stations (e.g., relay station 110r), also referred to as relays or the like, that receive a transmission of data and/or other information from an upstream station (e.g., a BS 110a or a UE 120r) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number $N_{ap}$ of antennas to achieve transmit diversity for downlink transmissions and/or receive diversity for uplink transmissions. A set $N_u$ of UEs 120 may receive downlink transmissions and transmit uplink transmissions. Each UE 120 may transmit user-specific data to and/or receive user-specific data from the BSs 110. In general, each UE 120 may be equipped with one or multiple antennas. The $N_u$ UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include at least one multi-mode voltage-controlled oscillator (VCO) circuit with transformer-based coupling, as described in more detail herein.

Figure 2:
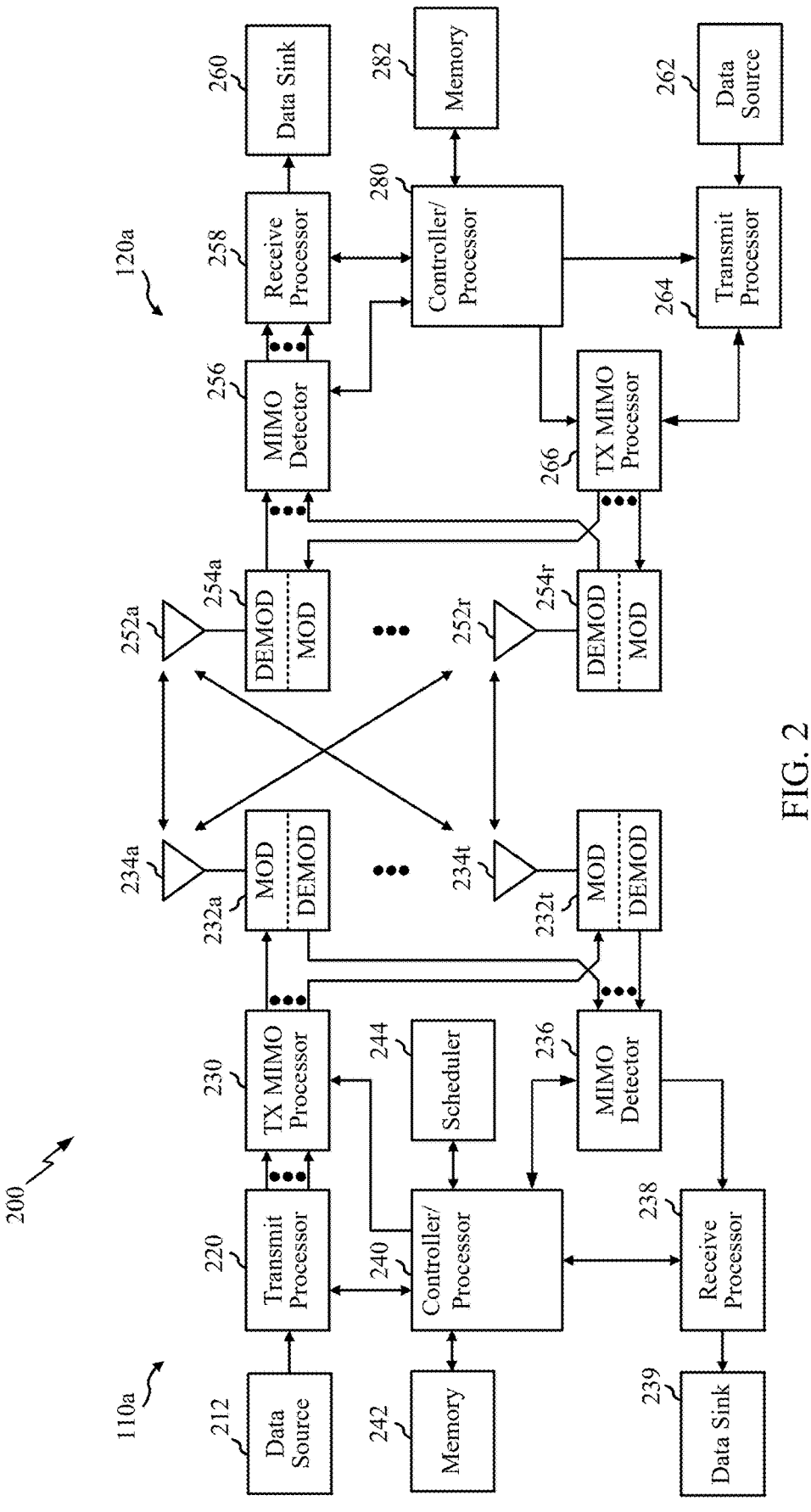
FIG. 2 is a block diagram conceptually illustrating a design of an example a base station (BS) and user equipment (UE), in which aspects of the present disclosure may be practiced.

FIG. 2 illustrates example components of BS 110*a* and UE 120*a* (e.g., from the wireless communications network 100 of FIG. 1), in which aspects of the present disclosure may be implemented.

On the downlink, at the BS 110*a*, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232*a*-232*t*. Each modulator in transceivers 232*a*-232*t* may process a respective output symbol stream (e.g., for orthogonal frequency division multiplexing (OFDM), etc.) to obtain an output sample stream. Each of the transceivers 232*a*-232*t* may further process (e.g., convert to analog, amplify, filter, and upconvert) the output sample stream to obtain a downlink signal. Downlink signals from the transceivers 232*a*-232*t* may be transmitted via the antennas 234*a*-234*t*, respectively.

At the UE 120*a*, the antennas 252*a*-252*r* may receive the downlink signals from the BS 110*a* and may provide received signals to the transceivers 254*a*-254*r*, respectively. The transceivers 254*a*-254*r* may condition (e.g., filter, amplify, downconvert, and digitize) a respective received signal to obtain input samples. Each demodulator (DEMOD) in the transceivers 232*a*-232*t* may further process the input samples (e.g., for OFDM, etc.) to obtain received symbols. A MIMO detector 256 may obtain received symbols from the demodulators in transceivers 254*a*-254*r*, perform MIMO detection on the received symbols if applicable, and provide detected symbols. A receive processor 258 may process (e.g., demodulate, deinterleave, and decode) the detected symbols, provide decoded data for the UE 120*a* to a data sink 260, and provide decoded control information to a controller/processor 280.

On the uplink, at UE 120*a*, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254*a*-254*r* (e.g., for single-carrier frequency division multiplexing (SC-FDM), etc.), and transmitted to the BS 110*a*. At the BS 110*a*, the uplink signals from the UE 120*a* may be received by the antennas 234, processed by the demodulators in transceivers 232*a*-232*t*, detected by a MIMO detector 236 if applicable, and further processed by a receive processor 238 to obtain decoded data and control information sent by the UE 120*a*. The receive processor 238 may provide the decoded data to a data sink 239 and the decoded control information to the controller/processor 240.

The memories 242 and 282 may store data and program codes for BS 110*a* and UE 120*a*, respectively. The memories 242 and 282 may also interface with the controllers/processors 240 and 280, respectively. A scheduler 244 may schedule UEs for data transmission on the downlink and/or uplink.

Antennas 252, processors 258, 264, 266, and/or controller/processor 280 of the UE 120*a* and/or antennas 234, processors 220, 230, 238, and/or controller/processor 240 of the BS 110a may be used to perform the various techniques and methods described herein.

In certain aspects of the present disclosure, the transceivers 232 and/or the transceivers 254 may include at least one multi-mode voltage-controlled oscillator (VCO) circuit with transformer-based coupling, as described in more detail herein.

Example RF Transceiver

Figure 3:
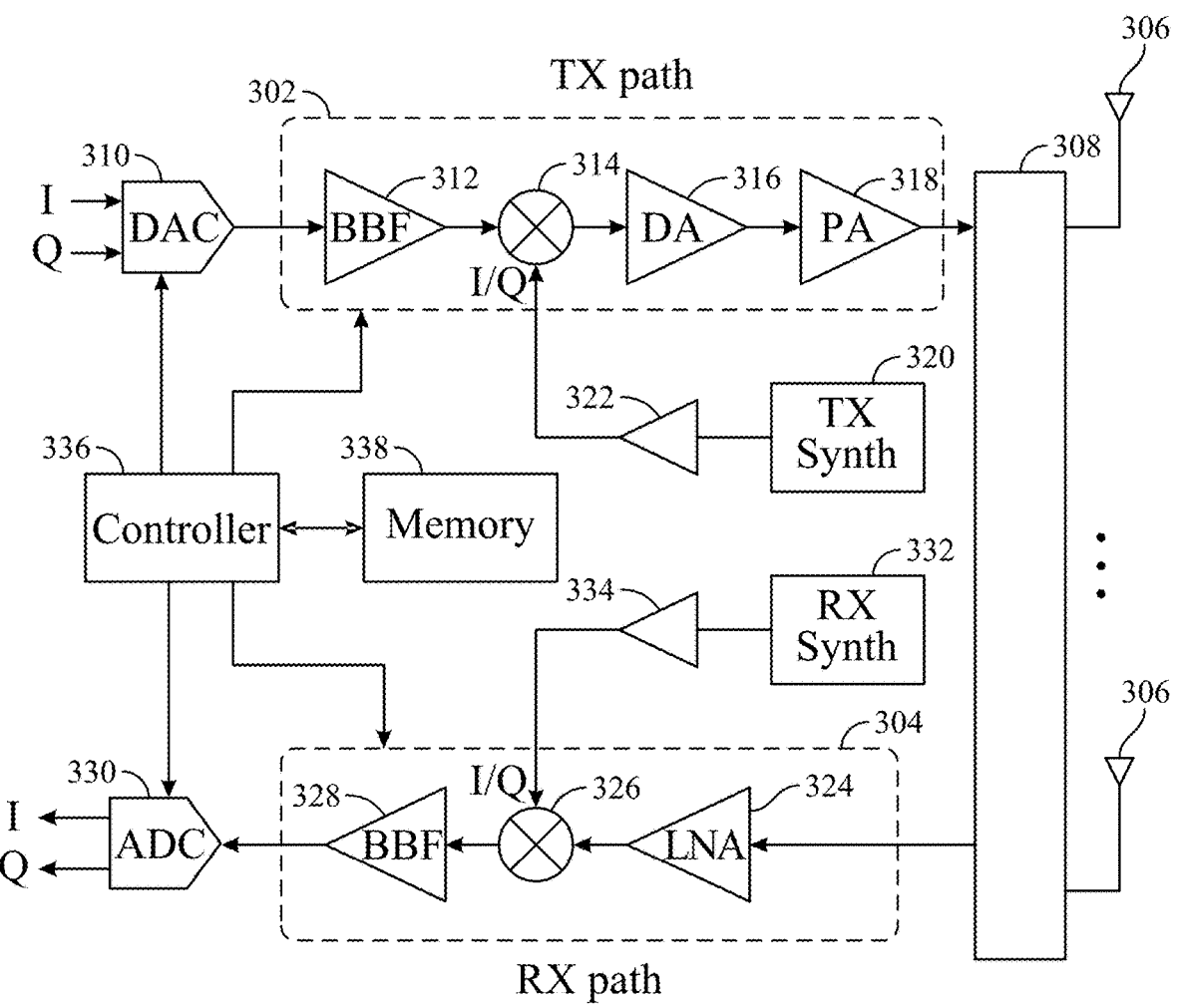
FIG. 3 is a block diagram of an example radio frequency (RF) transceiver, in which aspects of the present disclosure may be practiced.

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a VCO or a digitally controlled oscillator (DCO)) to generate a stable, tunable LO with a particular tuning range. Thus, the transmit LO may be produced by a TX frequency synthesizer 320 with a transmit phase-locked loop (TxPLL). The transmit LO may be buffered or amplified by amplifier 322 before being mixed with the baseband signals in the mixer 314.

Similarly, the receive LO may be produced by an RX frequency synthesizer 332 with a receive phase-locked loop (RxPLL). The receive LO may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer. For certain aspects, the RxPLL and/or the TxPLL may include a multi-mode VCO circuit with transformer-based coupling, as described in more detail herein.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for signal oscillation circuits in any of various other suitable systems (e.g., video monitors, microprocessors, high-speed serializer/deserializer (SerDes) systems, or other electronic systems).

Example Voltage-Controlled Oscillator

In modern transceivers, voltage-controlled oscillator (VCO) specifications may be different for various bands. For example, Global System for Mobile Communications (GSM) bands may call for superior phase noise, while Long-Term Evolution (LTE) bands may relax phase noise specifications, but demand high power efficiency. In some cases, an n-type metal-oxide-semiconductor (NMOS)-based VCO may be preferred to achieve the best phase noise with a limited supply voltage. In other cases, a complementary metal-oxide-semiconductor (CMOS)-based VCO may be preferred to achieve the best power efficiency.

To meet GSM/LTE bands specifications and save chip area, a VCO configurable to operate in either an NMOS or a CMOS mode may be preferred. In certain aspects, such a dual-mode VCO may use capacitively alternating current (AC)-coupled p-type metal-oxide-semiconductor (PMOS) transconductance cells (also referred to as "slices"). However, capacitively AC-coupled PMOS transconductance cells may oftentimes be inefficient, as the AC coupling capacitors may occupy significant chip area and often include bias resistors that may introduce extra noise.

Figure 4A:
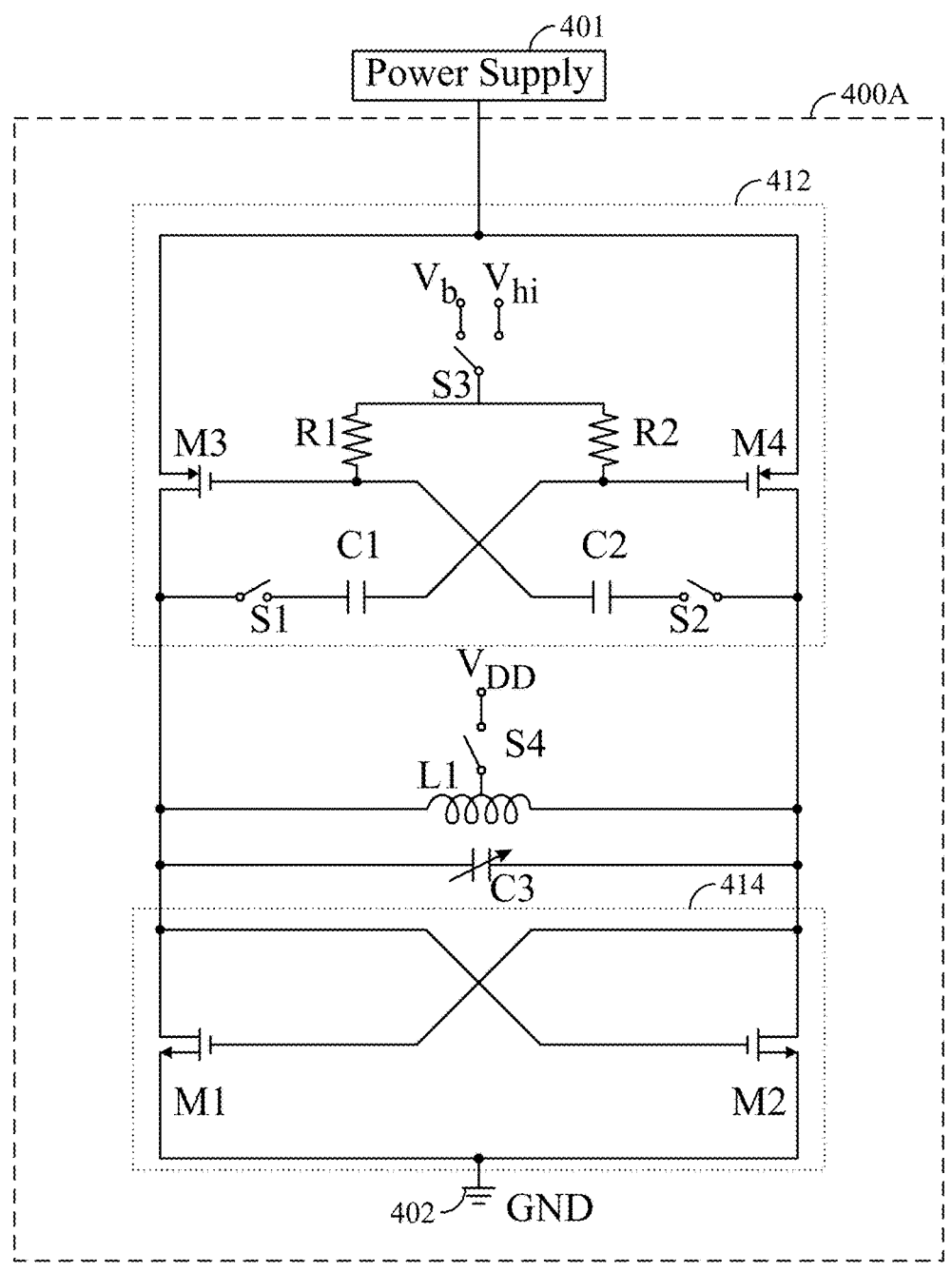
FIG. 4A is a schematic diagram of an example dual-mode voltage-controlled oscillator (VCO) that includes AC coupling capacitors and bias resistors.

FIG. 4A is a schematic diagram of an example dual-mode VCO 400A that includes AC coupling capacitors (e.g., capacitive elements C1 and C2) and bias resistors (e.g., resistive elements R1 and R2). The dual-mode VCO 400A may receive power from a power supply 401 with a power supply voltage (e.g., $V_{DD}$) referenced to a reference potential node 402 (e.g., electrical ground). As illustrated, the dual-mode VCO 400A may include a resonant circuit with an inductive element L1 (which may be a center-tapped inductor or may alternatively be implemented as two or more series inductors) and a capacitive element (e.g., a capacitive network, which may include varactors, such as varactor C3) coupled in parallel and designed to oscillate in a certain resonant frequency range. The inductive element L1 may also be referred to as a "main LC tank inductor." The inductive element L1 and/or the one or more capacitive elements may be variable (e.g., with varactor C3) to adjust the dual-mode VCO 400A frequency within a tuning range. The differential outputs of the VCO 400A may be taken across the resonant circuit (e.g., at opposite nodes coupled to different terminals of the inductive element L1).

The dual-mode VCO 400A may also include a pair of cross-coupled n-type transistors M1 and M2 that form an n-type active negative transconductance ($-g_m$) circuit 414. To achieve the cross-coupling in the $-g_m$ circuit 414, a gate of transistor M1 is coupled to a drain of transistor M2, and a gate of transistor M2 is coupled to a drain of transistor M1. Additionally, the dual-mode VCO 400A may include a pair of selectively cross-coupled p-type transistors M3 and M4 that form a p-type active negative transconductance circuit 412. The cross-coupled transistors serve to cancel out the loss (due to parasitics) of the resonant circuit and, thus, to sustain the oscillating mechanism of the dual-mode VCO 400A. As illustrated, the capacitive element C1 may be selectively coupled between a gate of transistor M4 and a drain of transistor M3, and the capacitive element C2 may be selectively coupled between a gate of transistor M3 and a drain of transistor M4. The resistive element R1 may be coupled to the gate of transistor M3, and the resistive element R2 may be coupled to the gate of transistor M4. The inductive element L1 and the capacitive element (e.g., varactor C3) may be coupled in parallel between the drains of transistors M1, M3 and the drains of transistors M2, M4, and the reference potential node 402 may be coupled to sources of transistors M1 and M2, as illustrated. It is to be understood that each of the transistors M1-M4 may represent a single transistor or multiple transistors coupled in parallel.

To implement switching between different modes, the VCO 400A may include one or more switches (e.g., represented by switches S1 and S2 in FIG. 4A) used to selectively cross-couple transistors M3 and M4. Switch S1 may be coupled between the capacitive element C1 and the drain of transistor M3, and switch S2 may be coupled between the capacitive element C2 and the drain of transistor M4, as illustrated.

The dual-mode VCO 400A may also include a switch S3 and a switch S4. Switch S3 may include (i) a first terminal coupled to resistive elements R1 and R2, (ii) a second terminal coupled to a bias voltage node (labeled "$V_b$"), and (iii) a third terminal coupled to a high voltage node (labeled "$V_{hi}$," such as a power supply rail), as illustrated. In this configuration, switch S3 may select between coupling the resistive elements R1, R2 to the bias voltage node (e.g., to bias the transistors M3, M4) or the high voltage node (e.g., to turn off transistors M3, M4). Switch S4 may include a first terminal coupled to a tap of the inductive element L1 and may include a second terminal coupled to a power supply node (labeled "$V_{DD}$"), also as illustrated.

FIG. 4A also includes a table 450A illustrating the switching states of the dual-mode VCO 400A during an NMOS mode (where only the n-type $-g_m$ circuit 414 is operating) and a CMOS mode (where both the p-type and n-type $-g_m$ circuits 412, 414 are operating). When operating in the NMOS mode, switches S1 and S2 are open (e.g., off), switch S3 is coupled to the high voltage $V_{hi}$ node, and switch S4 is closed (e.g., on) to effectively turn off (e.g., disable) the p-type $-g_m$ circuit 412 and couple the resonant tank inductive element L1 to the power supply $V_{DD}$ node, such that the VCO 400A generates an oscillating signal using only the resonant tank and the n-type $-g_m$ circuit 414. When operating in the CMOS mode, switches S1 and S2 are closed, switch S3 is coupled to the bias voltage $V_b$ node, and switch S4 is open, such that both the n-type active negative transconductance circuit 414 and p-type active negative transconductance circuit 412 are operational to generate an oscillating signal in conjunction with the resonant tank.

In certain aspects, the NMOS mode of the dual-mode VCO 400A of FIG. 4A may be a high performance NMOS mode (e.g., configured for tough phase noise specification GSM bands), and the CMOS mode of the dual-mode VCO 400A may be a low power CMOS mode (e.g., configured for LTE bands). In addition, the dual-mode capability of the dual-mode VCO 400A may save chip area, compared to using two separate VCOs. However, the dual-mode VCO 400A may have relatively low effective transconductance due to alternating current (AC) coupling, may include PMOS bias resistors (e.g., resistive elements R1 and R2) that may contribute noise, may include PMOS AC coupling capacitors (e.g., capacitive elements C1 and C2) that may occupy substantial area, may include complicated PMOS-related routings that may result in more parasitics, and/or may also lack transconductance slice control.

Example Multi-Mode Voltage-Controlled Oscillator (VCO) with Transformer-Based Coupling Certain aspects of the present disclosure provide a multi-mode VCO circuit with transformer-based coupling to achieve negative transconductance without AC coupling capacitors and bias resistors. Such a VCO circuit may include a transformer, a p-type active negative transconductance circuit, and an n-type active negative transconductance circuit. The p-type active negative transconductance circuit and/or the n-type active negative transconductance circuit may be implemented as multiple p-type metal-oxide-semiconductor (PMOS) and n-type metal-oxide-semiconductor (NMOS) transconductance slices, respectively. The VCO circuit may be configured for NMOS transconductance gate bias and/or PMOS transconductance gate bias through a tap of one or more secondary coils of the transformer. The VCO circuit may have a large coupled signal swing due to voltage gain from the transformer, resulting in high effective PMOS/NMOS transconductance and high startup gain. The activation or deactivation of each of the PMOS and/or NMOS slices may be controlled based on the desired transconductance. In some cases, additional PMOS and/or NMOS transconductance slices may be turned on to increase transconductance. In other cases, at least some PMOS and/or NMOS transconductance slices may be turned off to increase the power efficiency of the VCO circuit. Furthermore, the VCO circuit may include less complicated routing (when compared to the dual-mode VCO 400A of FIG. 4A), which may result in lower parasitics.

Figure 4B:
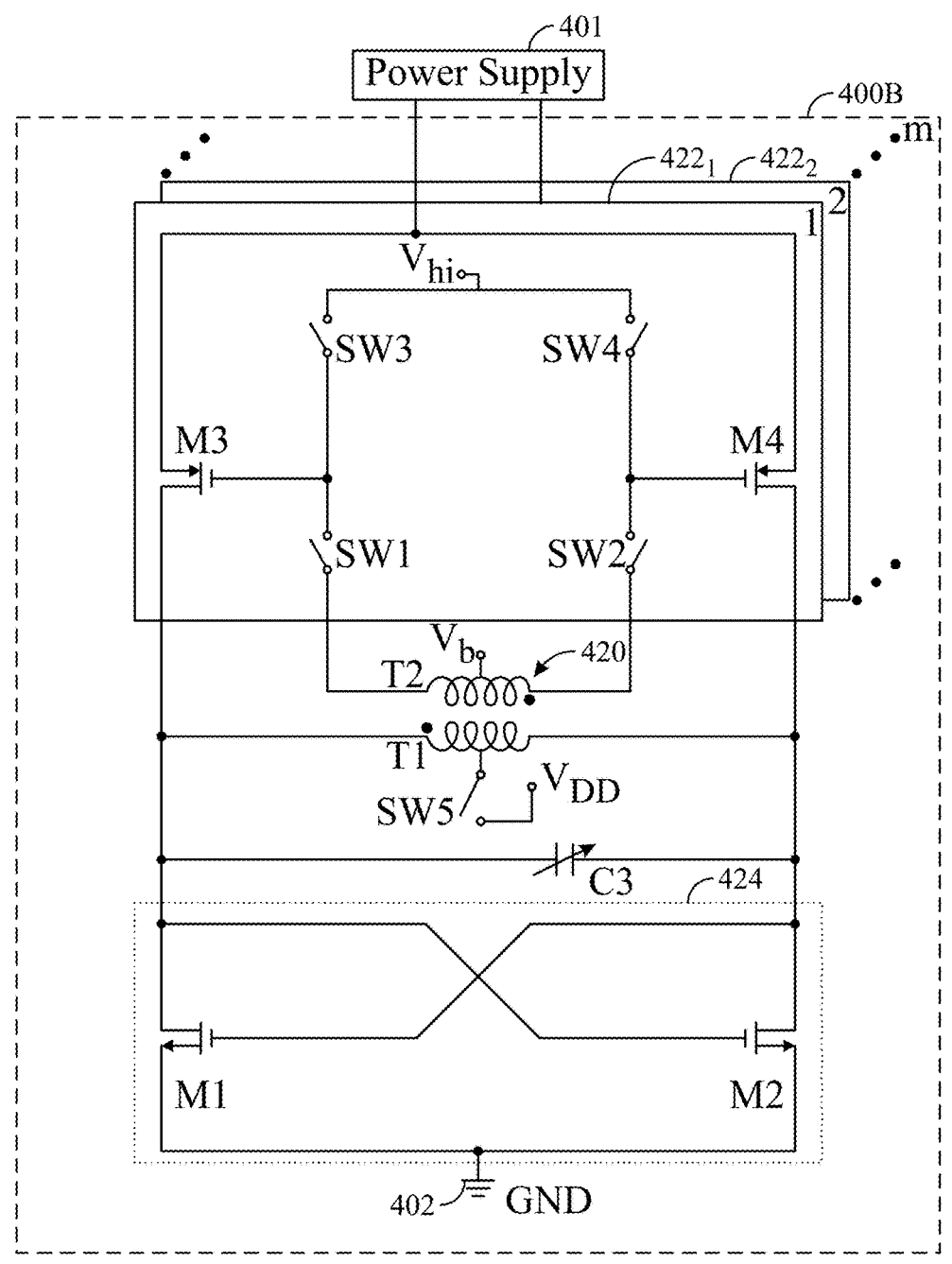
FIGS. 4B-4C are schematic diagrams of example dual-mode VCOs with transformer-based coupling, in accordance with certain aspects of the present disclosure.
Figure 4C:
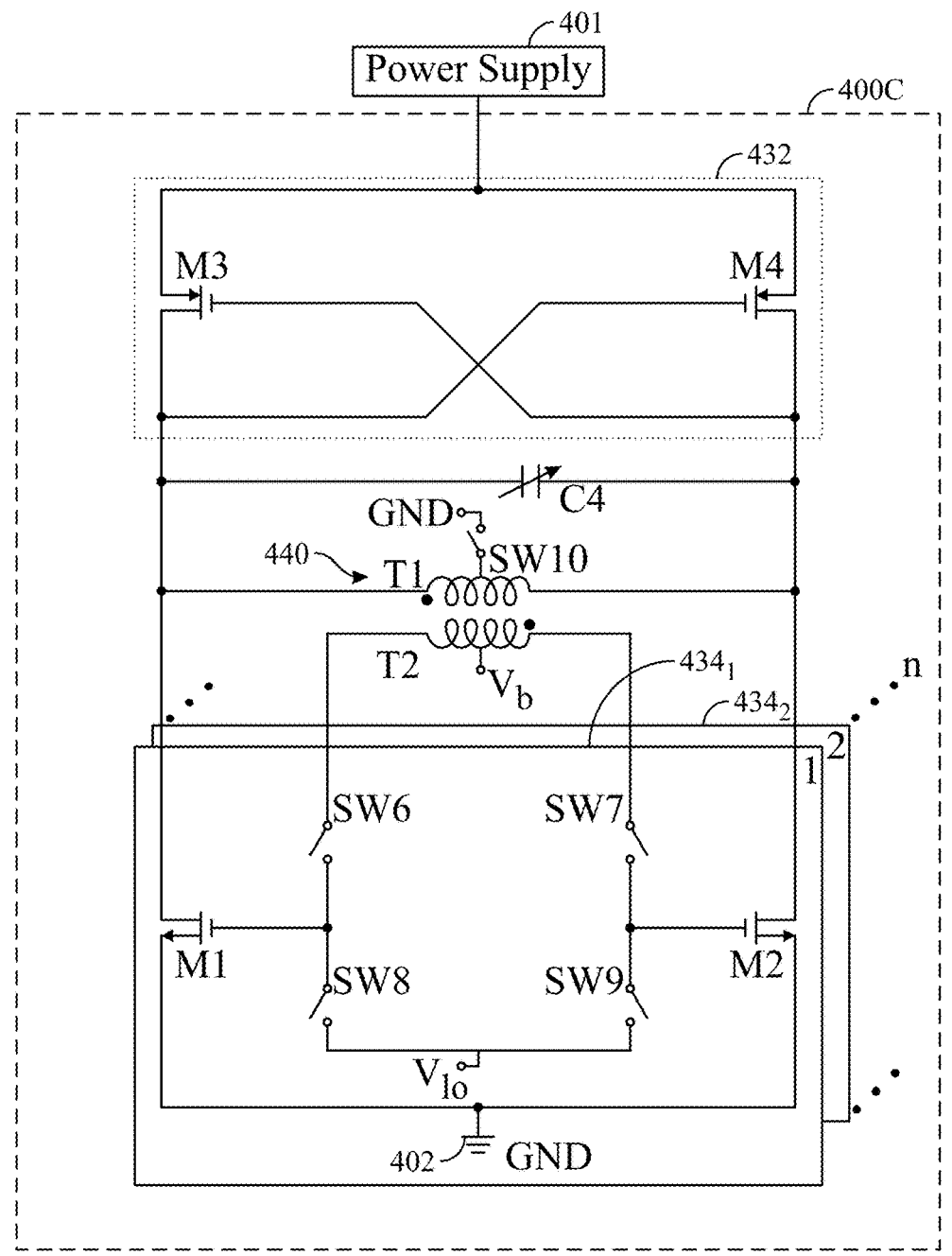

FIGS. 4B-4C are schematic diagrams of example dual-mode VCOs 400B, 400C with transformer-based coupling, in accordance with certain aspects of the present disclosure. Referring to FIG. 4B, the dual-mode VCO 400B may receive power from the power supply 401 with the power supply voltage (e.g., $V_{DD}$) referenced to the reference potential node 402 (e.g., electrical ground), similar to the dual-mode VCO 400A of FIG. 4A. As illustrated, the dual-mode VCO 400B may include a transformer 420 including a primary winding T1 and a secondary winding T2, with the primary winding T1 functioning as the inductive element of the resonance circuit (e.g., replacing inductive element L1 of FIG. 4A). The primary winding T1 may have opposite polarity to the secondary winding T2, as indicated by the dots in the circuit symbol for the transformer 420. The dual-mode VCO 400B also includes a pair of cross-coupled n-type transistors M1 and M2 that form an n-type active negative transconductance ($-g_m$) circuit 424. Additionally, the dual-mode VCO 400B includes a pair of p-type transistors M3 and M4 that can form a p-type active negative transconductance circuit $422_1$. The dual-mode VCO 400B may include one or more capacitive elements (e.g., the varactor C3) coupled between drains of transistors M1, M3 and drains of transistors M2, M4. The primary winding T1 may be coupled in parallel with the one or more capacitive elements, as shown.

For certain aspects, the dual-mode VCO 400B may include a first set of switches SW1 and SW2 coupled between gates of the p-type transistors M3 and M4 and different ends of the secondary winding T2 of the transformer 420. The dual-mode VCO 400B may also include a second set of switches SW3 and SW4 coupled between the gates of the p-type transistors M3 and M4 and the high voltage $V_{hi}$ node. The dual-mode VCO 400B may also include a switch SW5 including a first terminal coupled to a tap of the primary winding T1 and including a second terminal coupled to the power supply $V_{DD}$ node. A tap of the secondary winding T2 of the transformer 420 may be coupled to the bias voltage $V_b$ node.

FIG. 4B also includes a table 450B illustrating the switching states of the configurable dual-mode VCO 400B during an NMOS mode and a CMOS mode. When operating in the NMOS mode, switches SW1 and SW2 are open (e.g., off), switches SW3 and SW4 are closed (e.g., on), and switch SW5 is closed (e.g., on), such that the p-type active negative transconductance circuit $422_1$ is effectively off (e.g., disabled), the secondary winding T2 is disconnected from the transistors M3, M4, and the VCO 400B generates an oscillating signal (a differential signal across the primary winding T1) using only the resonant tank and the n-type $-g_m$ circuit 424. When operating in the CMOS mode, switches SW1 and SW2 are closed (e.g., on), switches SW3 and SW4 are open (e.g., off), and switch SW5 is open (e.g., off). In this manner, the p-type transistors M3 and M4 are coupled through the transformer 420 (as a result of the transformer-based coupling), and the gates of transistors M3 and M4 are biased through the secondary winding T2 by the bias voltage $V_b$, such that both the p-type and n-type $-g_m$ circuits $422_1$, 424 are operational to generate an oscillating signal (across the primary winding T1) in conjunction with the resonant tank.

In certain aspects, the dual-mode VCO 400B may include any number m of controllable (e.g., selectable) p-type active negative transconductance circuit slices $422_1$, $422_2$, . . . , $422_m$ (collectively referred to herein as "p-type active negative transconductance slices 422"). Each p-type active negative transconductance circuit slice 422 may include a pair of p-type transistors (similar to transistors M3, M4) and two sets of switches (similar to switches SW1-SW4), which may have the same topology as shown in p-type $-g_m$ circuit $422_1$. The activation or deactivation of each of the p-type slices 422 may be controlled based on the desired transconductance. The controllable p-type active negative transconductance circuit slices $422_1$, $422_2$, . . . , $422_m$ may be coupled in parallel (e.g., at respective differential VCO outputs of each slice and at nodes for coupling to terminals of the secondary winding T2).

The dual-mode VCO 400C of FIG. 4C may be similar to the dual-mode VCO 400B of FIG. 4B, and may include the pair of n-type transistors M1 and M2 that form part of an n-type active negative transconductance circuit $434_1$, the pair of p-type transistors M3 and M4 that form a p-type active negative transconductance circuit 432, the power supply 401, and the reference potential node 402, as illustrated. In the dual-mode VCO 400C, the p-type transistors M3 and M4 are cross-coupled, where the gate of transistor M3 is coupled to the drain of transistor M4 and where the gate of transistor M4 is coupled to the drain of transistor M3. The resonant circuit of the dual-mode VCO 400C may include one or more capacitive elements (e.g., a varactor C4) coupled between the drains of transistors M1, M3 and the drains of transistors M2, M4. The resonant circuit of the dual-mode VCO 400C may also include a transformer 440 that includes a primary winding T1 and a secondary winding T2.

For certain aspects, the dual-mode VCO 400C may include a first set of switches SW6 and SW7 coupled between gates of the n-type transistors M1 and M2, respectively, and different ends of the secondary winding T2 of the transformer 440. The dual-mode VCO 400C may also include a second set of switches SW8 and SW9 coupled between the gates of the n-type transistors M1 and M2 and a low voltage node (labeled "$V_{lo}$," such as a power supply rail, which may be electrical ground in some cases). The dual-mode VCO 400C may also include a switch SW10 including a first terminal coupled to a tap of the primary winding T1 and including a second terminal coupled to the reference potential node (labeled "GND"). A tap of the secondary winding T2 of the transformer 440 may be coupled to the bias voltage $V_b$ node.

FIG. 4C also includes a table 450C illustrating the switching states of the configurable dual-mode VCO 400C during a PMOS mode and a CMOS mode. When operating in the PMOS mode, switches SW6 and SW7 are open (e.g., off), switches SW8 and SW9 are closed (e.g., on), and switch SW10 is closed (e.g., on), such that the n-type active negative transconductance circuit $434_1$ is effectively off (e.g., disabled), the secondary winding T2 is disconnected from the transistors M1, M2, and the VCO 400C generates an oscillating signal using only the resonant tank and the p-type $-g_m$ circuit 432. When operating in the CMOS mode, switches SW6 and SW7 are closed (e.g., on), switches SW8 and SW9 are open (e.g., off), and switch SW10 is open (e.g., off). In this manner, the n-type transistors M1 and M2 are coupled through the transformer 440 (as a result of the transformer-based coupling), and the gates of transistors M1 and M2 are biased through the secondary winding T2 by the bias voltage $V_b$, such that both the p-type and n-type $-g_m$ circuits 432, $434_1$ are operational to generate an oscillating signal in conjunction with the resonant tank.

In certain aspects, the dual-mode VCO 400C may include any number n of (e.g., selectable) controllable n-type active negative transconductance circuit slices $434_1$, $434_2$, . . . , $434_n$ (collectively referred to herein as "n-type active negative transconductance slices 434"). Each n-type active negative transconductance circuit slice 434 may include a pair of cross-coupled n-type transistors (similar to transistors M1, M2) and two sets of switches (similar to switches SW6-SW9), which may have the same topology as shown in n-type $-g_m$ circuit $434_1$. The activation or deactivation of each of the n-type slices 434 may be controlled based on the desired transconductance. The controllable n-type active negative transconductance circuit slices $434_1$, $434_2$, . . . , $434_n$ may be coupled in parallel (e.g., at respective differential VCO outputs of each slice and at nodes for coupling to terminals of the secondary winding T2).

Figure 4D:
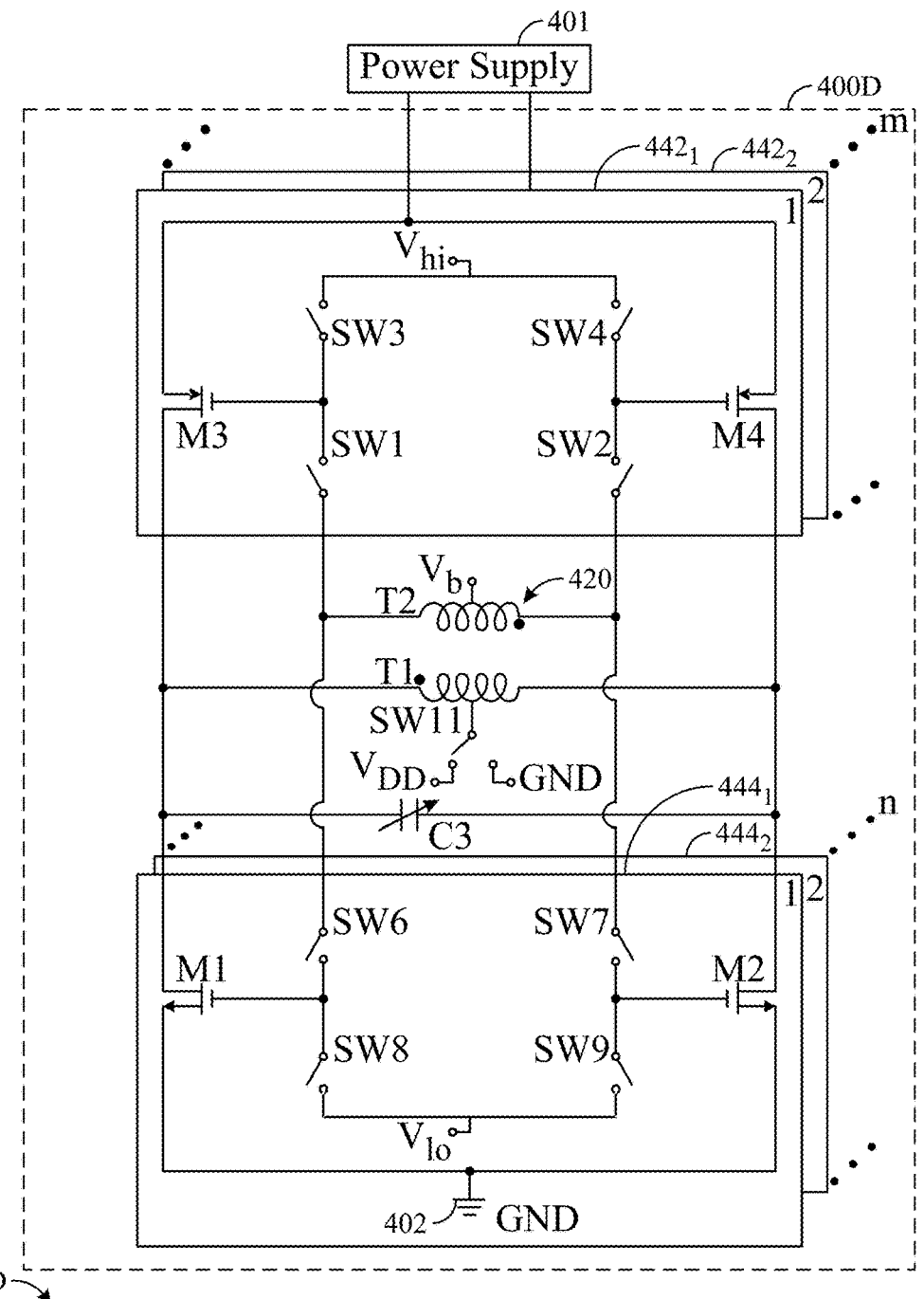
FIGS. 4D-4E are schematic diagrams of example tri-mode VCOs with transformer-based coupling, in accordance with certain aspects of the present disclosure.
Figure 4E:
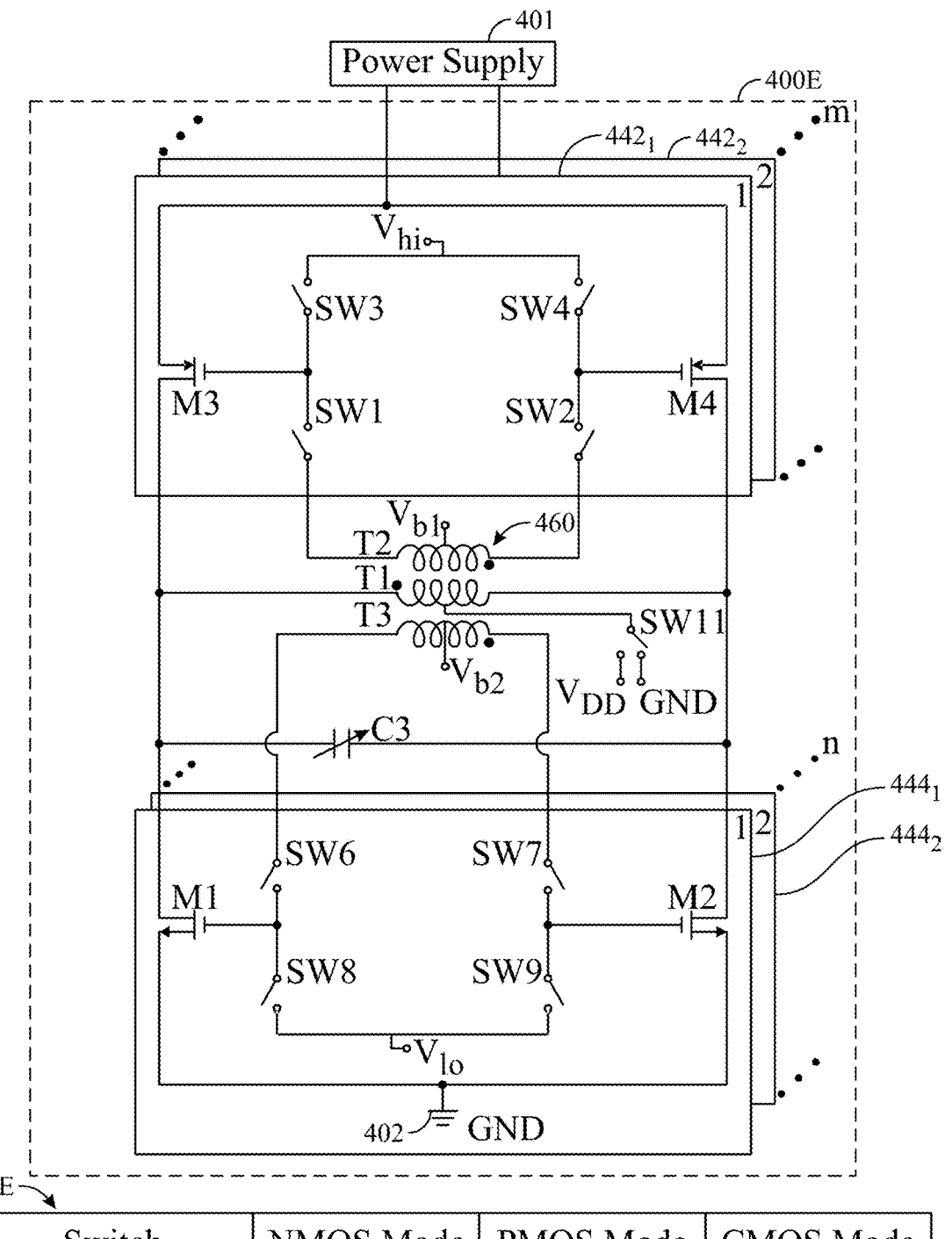

FIGS. 4D-4E are schematic diagrams of example tri-mode VCOs 400D, 400E with transformer-based coupling, in accordance with certain aspects of the present disclosure. The tri-mode VCO 400D of FIG. 4D may be similar to and reflect a combination of the dual-mode VCOs 400B, 400C of FIGS. 4B and 4C and may include the pair of n-type transistors M1 and M2 that form an n-type active negative transconductance circuit $444_1$, the pair of p-type transistors M3 and M4 that form a p-type active negative transconductance circuit $442_1$, switches SW1, SW2, SW3, SW4, SW6, SW7, SW8, SW9, the transformer 420, one or more capacitive elements (e.g., the varactor C3), the power supply 401, and the reference potential node 402, as illustrated. The resonant circuit of the tri-mode VCO 400D may be implemented by the primary winding T1 of the transformer 420 coupled in parallel with the one or more capacitive elements. The tri-mode VCO 400D may also include a switch SW11 including (i) a first terminal coupled to a tap of the primary winding T1, (ii) a second terminal coupled to the power supply $V_{DD}$ node, and (iii) a third terminal coupled to the reference potential node (labeled "GND"). In this configuration, switch SW11 may select between coupling the tap of the primary winding T1 to the power supply $V_{DD}$ node, to the reference potential node, or in some cases to an open circuit (e.g., a fourth terminal of switch SW11 coupled to nothing). A tap of the secondary winding T2 of the transformer 420 may be coupled to the bias voltage $V_b$ node.

FIG. 4D also includes a table 450D illustrating the switching states of the configurable tri-mode VCO 400D during an NMOS mode, a PMOS mode, and a CMOS mode. When operating in the NMOS mode, switches SW1 and SW2 are open (e.g., off), switches SW3 and SW4 are closed (e.g., on), switch SW11 is coupled to the power supply $V_{DD}$ node, switches SW6 and SW7 are closed (e.g., on), and switches SW8 and SW9 are open (e.g., off). In this configuration, the p-type active negative transconductance circuit $442_1$ is effectively off (e.g., disabled), the n-type active negative transconductance circuit $444_1$ is effectively on (e.g., enabled), and the secondary winding T2 is disconnected from the transistors M3, M4, but connected to the transistors M1, M2. With bias voltage provided from the bias voltage $V_b$ node to the gates of transistors M1 and M2 through the secondary winding T2, the VCO 400D generates an oscillating signal using only the resonant tank and the n-type $-g_m$ circuit $444_1$.

When operating in the PMOS mode, switches SW1 and SW2 are closed (e.g., on), switches SW3 and SW4 are open (e.g., off), switch SW11 is coupled to the reference potential node, switches SW6 and SW7 are open (e.g., off), and switches SW8 and SW9 are closed (e.g., on). In this configuration, the n-type active negative transconductance circuit $444_1$ is effectively off (e.g., disabled), the p-type active negative transconductance circuit $442_1$ is effectively on (e.g., enabled), and the secondary winding T2 is disconnected from the transistors M1, M2, but connected to the transistors M3, M4. With bias voltage provided from the bias voltage $V_b$ node to the gates of transistors M3 and M4 through the secondary winding T2, the VCO 400D generates an oscillating signal using only the resonant tank and the p-type $-g_m$ circuit $442_1$.

When operating in the CMOS mode, switches SW1 and SW2 are closed (e.g., on), switches SW3 and SW4 are open (e.g., off), switch SW11 is open (e.g., off, or connected to a fourth terminal coupled to nothing), switches SW6 and SW7 are closed (e.g., on), and switches SW8 and SW9 are open (e.g., off). In this manner, the pair of n-type transistors M1 and M2 and the pair of p-type transistors M3 and M4 are coupled through the transformer 420 (as a result of the transformer-based coupling), and the gates of transistors M1 and M2 and the gates of transistors M3 and M4 are biased through the secondary winding T2 by the bias voltage $V_b$, such that both the p-type and n-type $-g_m$ circuits $442_1$, $444_1$ are operational to generate an oscillating signal in conjunction with the resonant tank.

The tri-mode VCO 400E of FIG. 4E may be similar to the tri-mode VCO 400D of FIG. 4D and, as such, may include the pair of n-type transistors M1 and M2 that form part of the n-type active negative transconductance circuit $444_1$, the pair of p-type transistors M3 and M4 that form part of the p-type active negative transconductance circuit $442_1$, switches SW1, SW2, SW3, SW4, SW6, SW7, SW8, SW9, SW11, the power supply 401, and the reference potential node 402, as illustrated. The tri-mode VCO 400E may also include a transformer 460 that includes a primary winding T1, a secondary winding T2, and a tertiary winding T3. In the tri-mode VCO 400E, the secondary winding T2 may be coupled to the p-type active negative transconductance circuit $442_1$, and the tertiary winding T3 may be coupled to the n-type active negative transconductance circuit $444_1$. A tap of the secondary winding T2 of the transformer 460 may be coupled to a first bias voltage node (labeled "$V_{b1}$"), and a tap of the tertiary winding T3 of the transformer 460 may be coupled to a second bias voltage node (labeled "$V_{b2}$"). The voltages of the two bias nodes may be the same or different. In certain aspects, the first and second bias voltage nodes may the same bias voltage node. In certain aspects, the secondary winding T2 and the tertiary winding T3 may have different coupling coefficients, whereas in other aspects, the secondary winding T2 and the tertiary winding T3 may have the same coupling coefficient. Thus, a tri-mode VCO having a transformer with secondary and tertiary windings may allow for different coupling coefficients between such windings and/or the application of different bias voltages to such windings.

FIG. 4E also includes a table 450E illustrating the switching states of the configurable tri-mode VCO 400E during an NMOS mode, a PMOS mode, and a CMOS mode. When operating in the NMOS mode, switches SW1 and SW2 are open (e.g., off), switches SW3 and SW4 are closed (e.g., on), switch SW11 is coupled to the power supply $V_{DD}$ node, switches SW6 and SW7 are closed (e.g., on), and switches SW8 and SW9 are open (e.g., off). In this configuration, the p-type active negative transconductance circuit $442_1$ is effectively off (e.g., disabled), the n-type active negative transconductance circuit $444_1$ is effectively on (e.g., enabled), and the secondary winding T2 is disconnected from the transistors M3, M4, and the tertiary winding T3 is coupled to the transistors M1, M2. With bias voltage is provided from the second bias voltage $V_{b2}$ node to the gates of transistors M1 and M2 through the tertiary winding T3, the VCO 400E generates an oscillating signal (across the primary winding T1) using only the resonant tank and the n-type $-g_m$ circuit $444_1$.

When operating in the PMOS mode, switches SW1 and SW2 are closed, switches SW3 and SW4 are open, switch SW11 is coupled to the reference potential node, switches SW6 and SW7 are open, and switches SW8 and SW9 are closed. In this configuration, the n-type active negative transconductance circuit $444_1$ is effectively off (e.g., disabled), the p-type active negative transconductance circuit $442_1$ is effectively on (e.g., enabled), the secondary winding T2 is coupled to the transistors M3, M4, and the tertiary winding is disconnected from the transistors M1, M2. With bias voltage provided from the first bias voltage $V_{b1}$ node to the gates of transistors M3 and M4 through the secondary winding T2, the VCO 400E generates an oscillating signal using only the resonant tank and the p-type $-g_m$ circuit $442_1$.

When operating in the CMOS mode, switches SW1 and SW2 are closed, switches SW3 and SW4 are open, switch SW11 is open (or connected to a fourth terminal coupled to nothing), switches SW6 and SW7 are closed, and switches SW8 and SW9 are open. In this manner, the pair of n-type transistors M1 and M2 and the pair of p-type transistors M3 and M4 are coupled through the transformer 460 (as a result of the transformer-based coupling), the gates of transistors M1 and M2 are biased through the tertiary winding T3 by the second bias voltage $V_{b2}$, and the gates of transistors M3 and M4 are biased through the secondary winding T2 by the first bias voltage $V_{b1}$, such that both the p-type and n-type $-g_m$ circuits $442_1$, $444_1$ are operational to generate an oscillating signal at the output of the VCO 400E in conjunction with the resonant tank.

In certain aspects, the tri-mode VCOs 400D, 400E may include a number n of controllable (e.g., selectable) n-type active negative transconductance circuit slices $444_1$, $444_2$, . . . , $444_n$ (collectively referred to herein as "n-type active negative transconductance slices 444") and/or a number m of controllable p-type active negative transconductance circuit slices $442_1$, $442_2$, . . . , $442_m$ (collectively referred to herein as "p-type active negative transconductance slices 442"). The number n of n-type slices 444 may be the same as or different from the number m of p-type slices 442. Each n-type active negative transconductance circuit slice 444 may include a pair of n-type transistors (similar to transistors M1, M2) and two sets of switches (similar to switches SW6-SW9), which may have the same topology as shown in n-type $-g_m$ circuit $444_1$. Each p-type active negative transconductance circuit slice 442 may include a pair of p-type transistors (similar to transistors M3, M4) and two sets of switches (similar to switches SW1-SW4), which may have the same topology as shown in p-type $-g_m$ circuit $442_1$. The controllable n-type active negative transconductance circuit slices $442_1$, $442_2$, . . . , $442_m$ may be coupled in parallel. The activation or deactivation of each of the n-type slices 444 and/or the p-type slices 442 may be controlled based on the desired transconductance for the respective active negative transconductance circuit.

Example Operations for Oscillating Signal Generation

FIG. 5 is a flow diagram of example operations 500 for generating an oscillating signal, in accordance with certain aspects of the present disclosure. The operations 500 may be performed, for example, by a multi-mode voltage-controlled oscillator (VCO) circuit with transformer-based coupling (e.g., VCO 400B, 400C, 400D, 400E of FIGS. 4B, 4C, 4D, and 4E, respectively).

The operations 500 may begin, at block 510, with the VCO circuit controlling a first set of switches (e.g., switches SW1/SW2 or SW6/SW7) coupled between gates of a first pair of transistors (e.g., transistors M3/M4 or M1/M2) for a first active negative transconductance circuit (e.g., $-g_m$ circuit 432 or 424) and a secondary winding (e.g., winding T2) of a transformer (e.g., transformer 420 or 440). At block 520, the VCO circuit may control a second set of switches (e.g., switches SW3/SW4 or SW8/SW9) coupled between the gates of the first pair of transistors and a first voltage node (e.g., the high voltage $V_{hi}$ node or the low voltage $V_{lo}$ node). A primary winding (e.g., winding T1) of the transformer may be coupled to a second pair of transistors (e.g., transistors M1/M2 or M3/M4) for a second active negative transconductance circuit (e.g., $-g_m$ circuit 424 or 432).

According to certain aspects, the operations 500 further involves the VCO circuit controlling a switch (e.g., switch SW5 or SW10) including a first terminal coupled to a tap of the primary winding and including a second terminal coupled to a second voltage node (e.g., $V_{DD}$ or GND). In a first mode (e.g., a PMOS or NMOS mode): (i) controlling the first set of switches at block 510 may include opening the first set of switches; (ii) controlling the second set of switches at block 520 may involve closing the second set of switches; and (iii) controlling the switch may include closing the switch to couple the tap of the primary winding to the second voltage node, such that the first active negative transconductance circuit is disabled and the second pair of transistors are effectively cross-coupled in the second active negative transconductance circuit. In a second mode (e.g., a CMOS mode): (i) controlling the first set of switches at block 510 may include closing the first set of switches; (ii) controlling the second set of switches at block 520 may involve opening the second set of switches; and (iii) controlling the switch may include opening the switch.

According to certain aspects, the operations 500 further involve: (i) controlling a third set of switches (e.g., switches SW6/SW7 or SW1/SW2) coupled between gates of the second pair of transistors and the secondary winding of the transformer; and (ii) controlling a fourth set of switches (e.g., switches SW8/SW9 or SW3/SW4) coupled between the gates of the second pair of transistors and a third voltage node (e.g., the low voltage $V_{lo}$ node or the high voltage $V_{hi}$ node). In this case, the switch may further include a third terminal coupled to a fourth voltage node (e.g., GND or $V_{DD}$). The switch can be configured to at least one of: be open, couple the first terminal to the second terminal, or couple the first terminal to the third terminal. In a first mode (e.g., an NMOS mode): (i) controlling the first set of switches at block 510 may involve opening the first set of switches; (ii) controlling the second set of switches at block 520 may include closing the second set of switches; (iii) controlling the switch may include coupling the tap of the primary winding to the second voltage node; (iv) controlling the third set of switches may involve closing the third set of switches; and (v) controlling the fourth set of switches may involve opening the fourth set of switches, such that the first active negative transconductance circuit is disabled. In a second mode (e.g., a PMOS mode): (i) controlling the first set of switches at block 510 may include closing the first set of switches; (ii) controlling the second set of switches at block 520 may involve opening the second set of switches; (iii) controlling the switch may involve coupling the tap of the primary winding to the fourth voltage node (e.g., GND); (iv) controlling the third set of switches may include opening the third set of switches; and (v) controlling the fourth set of switches may include closing the fourth set of switches, such that the second active negative transconductance circuit is disabled. In a third mode (e.g., a CMOS mode): (i) controlling the first set of switches at block 510 may include closing the first set of switches; (ii) controlling the second set of switches may include opening the second set of switches; (iii) controlling the switch may involve opening the switch; (iv) controlling the third set of switches may include closing the third set of switches; and (v) controlling the fourth set of switches may include opening the fourth set of switches.

In certain aspects, the second voltage node is a power supply rail (e.g., $V_{DD}$) for the VCO circuit. In this case, the fourth voltage node may be a reference potential node (e.g., GND) for the VCO circuit.

According to certain aspects, the first active negative transconductance circuit comprises a plurality of controllable active negative transconductance cells (e.g., slices 422 or 434). One of the controllable active negative transconductance cells includes the first pair of transistors, the first set of switches, and the second set of switches. In this case, the operations 500 may further include controlling a number of the plurality of controllable active negative transconductance cells for operation of the VCO circuit.

Example Aspects

In addition to the various aspects described above, specific combinations of aspects are within the scope of the present disclosure, some of which are detailed below:

Aspect 1: A voltage-controlled oscillator (VCO) circuit comprising: a first pair of transistors for a first active negative transconductance circuit; a second pair of transistors for a second active negative transconductance circuit; a transformer comprising a primary winding and a secondary winding, the primary winding being coupled to the second pair of transistors; a first set of switches coupled between gates of the first pair of transistors and the secondary winding of the transformer; and a second set of switches coupled between the gates of the first pair of transistors and a first voltage node.

Aspect 2: The VCO circuit of Aspect 1, further comprising a switch including a first terminal coupled to a tap of the primary winding and including a second terminal coupled to a second voltage node.

Aspect 3: The VCO circuit of Aspect 2, wherein in a first mode: the first set of switches are configured to be open, the second set of switches are configured to be closed, and the switch is configured to be closed to couple the tap of the primary winding to the second voltage node.

Aspect 4: The VCO circuit of Aspect 3, wherein in the first mode, the first active negative transconductance circuit is disabled and the second pair of transistors are effectively cross-coupled in the second active negative transconductance circuit.

Aspect 5: The VCO circuit of Aspect 3 or 4, wherein in a second mode: the first set of switches are configured to be closed, the second set of switches are configured to be open, and the switch is configured to be open.

Aspect 6: The VCO circuit of Aspect 2, further comprising: a third set of switches coupled between gates of the second pair of transistors and the secondary winding of the transformer; and a fourth set of switches coupled between the gates of the second pair of transistors and a third voltage node, wherein the switch further includes a third terminal coupled to a fourth voltage node and wherein the switch can be configured to at least one of: be open, couple the first terminal to the second terminal, or couple the first terminal to the third terminal.

Aspect 7: The VCO circuit of Aspect 6, wherein in a first mode: the first set of switches are configured to be open; the second set of switches are configured to be closed; the switch is configured to couple the tap of the primary winding to the second voltage node; the third set of switches are configured to be closed; the fourth set of switches are configured to be open; and the first active negative transconductance circuit is disabled.

Aspect 8: The VCO circuit of Aspect 7, wherein in a second mode: the first set of switches are configured to be closed; the second set of switches are configured to be open; the switch is configured to couple the tap of the primary winding to the fourth voltage node; the third set of switches are configured to be open; the fourth set of switches are configured to be closed; and the second active negative transconductance circuit is disabled.

Aspect 9: The VCO circuit of Aspect 8, wherein in a third mode: the first set of switches are configured to be closed; the second set of switches are configured to be open; the switch is configured to be open; the third set of switches are configured to be closed; and the fourth set of switches are configured to be open.

Aspect 10: The VCO circuit of any of Aspects 6 to 9, wherein the second voltage node comprises a power supply rail for the VCO circuit and wherein the fourth voltage node comprises a reference potential node for the VCO circuit.

Aspect 11: The VCO circuit of any of Aspects 1 to 10, wherein the first active negative transconductance circuit comprises a plurality of controllable active negative transconductance cells and wherein one of the controllable active negative transconductance cells comprises the first pair of transistors, the first set of switches, and the second set of switches.

Aspect 12: The VCO circuit of any of Aspects 1 to 11, wherein the VCO circuit lacks an alternating current (AC) coupling capacitor coupled between transistors in the first pair of transistors.

Aspect 13: The VCO circuit of any of Aspects 1 to 12, wherein the gates of the first pair of transistors are directly connected to the secondary winding via respective switches of the first set of switches.

Aspect 14: The VCO circuit of any of Aspects 1 to 5, further comprising a third set of switches, wherein the transformer further comprises a tertiary winding and wherein the third set of switches are coupled between gates of the second pair of transistors and the tertiary winding of the transformer.

Aspect 15: The VCO circuit of Aspect 14, wherein the secondary winding and the tertiary winding have different coupling coefficients.

Aspect 16: The VCO circuit of any of Aspects 1 to 15, wherein the primary winding is coupled to drains of the first pair of transistors and to drains of the second pair of transistors.

Aspect 17: A method of oscillating signal generation using a voltage-controlled oscillator (VCO) circuit, the method comprising: controlling a first set of switches coupled between gates of a first pair of transistors for a first active negative transconductance circuit and a secondary winding of a transformer; and controlling a second set of switches coupled between the gates of the first pair of transistors and a first voltage node, wherein a primary winding of the transformer is coupled to a second pair of transistors for a second active negative transconductance circuit.

Aspect 18: The method of Aspect 17, further comprising controlling a switch including a first terminal coupled to a tap of the primary winding and including a second terminal coupled to a second voltage node.

Aspect 19: The method of Aspect 18, wherein in a first mode: controlling the first set of switches comprises opening the first set of switches; controlling the second set of switches comprises closing the second set of switches; and controlling the switch comprises closing the switch to couple the tap of the primary winding to the second voltage node, such that the first active negative transconductance circuit is disabled and the second pair of transistors are effectively cross-coupled in the second active negative transconductance circuit.

Aspect 20: The method of Aspect 19, wherein in a second mode: controlling the first set of switches comprises closing the first set of switches; controlling the second set of switches comprises opening the second set of switches; and controlling the switch comprises opening the switch.

Aspect 21: The method of Aspect 18, further comprising: controlling a third set of switches coupled between gates of the second pair of transistors and the secondary winding of the transformer; and controlling a fourth set of switches coupled between the gates of the second pair of transistors and a third voltage node, wherein the switch further includes a third terminal coupled to a fourth voltage node and wherein the switch can be configured to at least one of: be open, couple the first terminal to the second terminal, or couple the first terminal to the third terminal.

Aspect 22: The method of Aspect 21, wherein in a first mode: controlling the first set of switches comprises opening the first set of switches; controlling the second set of switches comprises closing the second set of switches; controlling the switch comprises coupling the tap of the primary winding to the second voltage node; controlling the third set of switches comprises closing the third set of switches; and controlling the fourth set of switches comprises opening the fourth set of switches, such that the first active negative transconductance circuit is disabled.

Aspect 23: The method of Aspect 22, wherein in a second mode: controlling the first set of switches comprises closing the first set of switches; controlling the second set of switches comprises opening the second set of switches; controlling the switch comprises coupling the tap of the primary winding to the fourth voltage node; controlling the third set of switches comprises opening the third set of switches; and controlling the fourth set of switches comprises closing the fourth set of switches, such that the second active negative transconductance circuit is disabled.

Aspect 24: The method of Aspect 23, wherein in a third mode: controlling the first set of switches comprises closing the first set of switches; controlling the second set of switches comprises opening the second set of switches; controlling the switch comprises opening the switch; controlling the third set of switches comprises closing the third set of switches; and controlling the fourth set of switches comprises opening the fourth set of switches.

Aspect 25: The method of Aspect 23 or 24, wherein the second voltage node comprises a power supply rail for the VCO circuit and wherein the fourth voltage node comprises a reference potential node for the VCO circuit.

Aspect 26: The method of any of Aspects 17 to 25, wherein: the first active negative transconductance circuit comprises a plurality of controllable active negative transconductance cells; one of the controllable active negative transconductance cells comprises the first pair of transistors, the first set of switches, and the second set of switches; and the method further comprises controlling a number of the plurality of controllable active negative transconductance cells for operation of the VCO circuit.

ADDITIONAL CONSIDERATIONS

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A voltage-controlled oscillator (VCO) circuit comprising:
   a first pair of transistors for a first active negative transconductance circuit;
   a second pair of transistors for a second active negative transconductance circuit;
   a transformer comprising a primary winding and a secondary winding, the primary winding being coupled between drains of the second pair of transistors;
   a first set of switches coupled between gates of the first pair of transistors and the secondary winding of the transformer; and
   a second set of switches coupled between the gates of the first pair of transistors and a first voltage node.

2. The VCO circuit of claim 1, further comprising a switch including a first terminal coupled to a tap of the primary winding and including a second terminal coupled to a second voltage node.

3. The VCO circuit of claim 2, wherein in a first mode:
   the first set of switches are configured to be open;
   the second set of switches are configured to be closed; and
   the switch is configured to be closed to couple the tap of the primary winding to the second voltage node.

4. The VCO circuit of claim 3, wherein in the first mode, the first active negative transconductance circuit is disabled and the second pair of transistors are effectively cross-coupled in the second active negative transconductance circuit.

5. The VCO circuit of claim 3, wherein in a second mode:
   the first set of switches are configured to be closed;
   the second set of switches are configured to be open; and
   the switch is configured to be open.

6. The VCO circuit of claim 2, further comprising:

a third set of switches coupled between gates of the second pair of transistors and the secondary winding of the transformer; and a fourth set of switches coupled between the gates of the second pair of transistors and a third voltage node, wherein the switch further includes a third terminal coupled to a fourth voltage node and wherein the switch can be configured to at least one of: be open, couple the first terminal to the second terminal, or couple the first terminal to the third terminal.

7. The VCO circuit of claim 6, wherein in a first mode:

the first set of switches are configured to be open;

the second set of switches are configured to be closed;

the switch is configured to couple the tap of the primary winding to the second voltage node;

the third set of switches are configured to be closed;

the fourth set of switches are configured to be open; and the first active negative transconductance circuit is disabled.

8. The VCO circuit of claim 7, wherein in a second mode:

the first set of switches are configured to be closed;

the second set of switches are configured to be open;

the switch is configured to couple the tap of the primary winding to the fourth voltage node;

the third set of switches are configured to be open;

the fourth set of switches are configured to be closed; and the second active negative transconductance circuit is disabled.

9. The VCO circuit of claim 8, wherein in a third mode:

the first set of switches are configured to be closed;

the second set of switches are configured to be open;

the switch is configured to be open;

the third set of switches are configured to be closed; and the fourth set of switches are configured to be open.

10. The VCO circuit of claim 8, wherein the second voltage node comprises a power supply rail for the VCO circuit and wherein the fourth voltage node comprises a reference potential node for the VCO circuit.

11. The VCO circuit of claim 1, wherein the first active negative transconductance circuit comprises a plurality of controllable active negative transconductance cells and wherein one of the controllable active negative transconductance cells comprises the first pair of transistors, the first set of switches, and the second set of switches.

12. The VCO circuit of claim 1, wherein the VCO circuit lacks an alternating current (AC) coupling capacitor coupled between transistors in the first pair of transistors.

13. The VCO circuit of claim 1, wherein the gates of the first pair of transistors are directly connected to the secondary winding via respective switches of the first set of switches.

14. The VCO circuit of claim 1, further comprising a third set of switches, wherein the transformer further comprises a tertiary winding and wherein the third set of switches are coupled between gates of the second pair of transistors and the tertiary winding of the transformer.

15. The VCO circuit of claim 14, wherein the secondary winding and the tertiary winding have different coupling coefficients.

16. The VCO circuit of claim 1, wherein the primary winding is coupled to drains of the first pair of transistors and to the drains of the second pair of transistors.

17. A method of oscillating signal generation using a voltage-controlled oscillator (VCO) circuit, the method comprising:

controlling a first set of switches coupled between gates of a first pair of transistors for a first active negative transconductance circuit and a secondary winding of a transformer; and controlling a second set of switches coupled between the gates of the first pair of transistors and a first voltage node, wherein a primary winding of the transformer is coupled between drains of a second pair of transistors for a second active negative transconductance circuit.

18. The method of claim 17, further comprising controlling a switch including a first terminal coupled to a tap of the primary winding and including a second terminal coupled to a second voltage node.

19. The method of claim 18, wherein in a first mode:

controlling the first set of switches comprises opening the first set of switches;

controlling the second set of switches comprises closing the second set of switches; and controlling the switch comprises closing the switch to couple the tap of the primary winding to the second voltage node, such that the first active negative transconductance circuit is disabled and the second pair of transistors are effectively cross-coupled in the second active negative transconductance circuit.

20. The method of claim 19, wherein in a second mode:

controlling the first set of switches comprises closing the first set of switches;

controlling the second set of switches comprises opening the second set of switches; and controlling the switch comprises opening the switch.

21. The method of claim 18, further comprising:

controlling a third set of switches coupled between gates of the second pair of transistors and the secondary winding of the transformer; and controlling a fourth set of switches coupled between the gates of the second pair of transistors and a third voltage node, wherein the switch further includes a third terminal coupled to a fourth voltage node and wherein the switch can be configured to at least one of: be open, couple the first terminal to the second terminal, or couple the first terminal to the third terminal.

22. The method of claim 21, wherein in a first mode:

controlling the first set of switches comprises opening the first set of switches;

controlling the second set of switches comprises closing the second set of switches;

controlling the switch comprises coupling the tap of the primary winding to the second voltage node;

controlling the third set of switches comprises closing the third set of switches; and controlling the fourth set of switches comprises opening the fourth set of switches, such that the first active negative transconductance circuit is disabled.

23. The method of claim 22, wherein in a second mode:

controlling the first set of switches comprises closing the first set of switches;

controlling the second set of switches comprises opening the second set of switches;

controlling the switch comprises coupling the tap of the primary winding to the fourth voltage node;

controlling the third set of switches comprises opening the third set of switches; and controlling the fourth set of switches comprises closing the fourth set of switches, such that the second active negative transconductance circuit is disabled.

24. The method of claim 23, wherein in a third mode:

controlling the first set of switches comprises closing the first set of switches;

controlling the second set of switches comprises opening the second set of switches;

controlling the switch comprises opening the switch;

controlling the third set of switches comprises closing the third set of switches; and controlling the fourth set of switches comprises opening the fourth set of switches.

25. The method of claim 23, wherein the second voltage node comprises a power supply rail for the VCO circuit and wherein the fourth voltage node comprises a reference potential node for the VCO circuit.

26. The method of claim 17, wherein:

the first active negative transconductance circuit comprises a plurality of controllable active negative transconductance cells;

one of the controllable active negative transconductance cells comprises the first pair of transistors, the first set of switches, and the second set of switches; and the method further comprises controlling a number of the plurality of controllable active negative transconductance cells for operation of the VCO circuit.

\* \* \* \* \*